United States Patent
Heo et al.

(10) Patent No.: US 10,714,500 B2
(45) Date of Patent: Jul. 14, 2020

(54) ELECTRONIC DEVICE AND METHOD OF MANUFACTURING THE SAME

(71) Applicant: Samsung Electronics Co., Ltd., Suwon-si, Gyeonggi-do (KR)

(72) Inventors: Jinseong Heo, Seoul (KR); Yunseong Lee, Osan (KR); Sanghyun Jo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/244,243

(22) Filed: Jan. 10, 2019

(65) Prior Publication Data

US 2020/0058658 A1 Feb. 20, 2020

(30) Foreign Application Priority Data

Aug. 20, 2018 (KR) .......................... 10-2018-0096827

(51) Int. Cl.
*H01L 29/78* (2006.01)
*H01L 27/11* (2006.01)
(Continued)

(52) U.S. Cl.
CPC ........ *H01L 27/1159* (2013.01); *G11C 11/223* (2013.01); *H01L 29/40111* (2019.08);
(Continued)

(58) Field of Classification Search
CPC ... H01L 29/40; H01L 29/401; H01L 29/4011; H01L 29/40111; H01L 29/78;
(Continued)

(56) References Cited

U.S. PATENT DOCUMENTS 8,729,614 B2 5/2014 Ahn et al.
9,608,110 B2 * 3/2017 Baars ................ H01L 29/78391
(Continued)

FOREIGN PATENT DOCUMENTS

| JP | 2004-356464 A | 12/2004 |
|---|---|---|
| KR | 10-2013-0021836 A | 3/2013 |
| KR | 10-2013-0028957 A | 3/2013 |

OTHER PUBLICATIONS

A. Toriumi et al. IEDM (2017) 1502 Perspective of Negative Capacitance FinFETs Investigated by Transient TCAD Simulation.
(Continued)

*Primary Examiner* — Monica D Harrison
(74) *Attorney, Agent, or Firm* — Harness, Dickey & Pierce, P.L.C.

(57) ABSTRACT

Provided are an electronic device and a method of manufacturing the same. The electronic device may include a first device provided on a first region of a substrate; and a second device provided on a second region of the substrate, wherein the first device may include a first domain layer including a ferroelectric domain and a first gate electrode on the first domain layer, and the second device may include a second domain layer including a ferroelectric domain and a second gate electrode on the second domain layer. The first domain layer and the second domain layer may have different characteristics from each other at a polarization change according to an electric field. At the polarization change according to the electric field, the first domain layer may have substantially a non-hysteretic behavior characteristic and the second domain layer may have a hysteretic behavior characteristic.

22 Claims, 19 Drawing Sheets

(51) Int. Cl.
    *H01L 27/1159*    (2017.01)
    *H01L 29/66*      (2006.01)
    *G11C 11/22*     (2006.01)
    *H01L 21/28*     (2006.01)
    *G06N 3/063*     (2006.01)

(52) U.S. Cl.
    CPC .... *H01L 29/6684* (2013.01); *H01L 29/78391* (2014.09); *G06N 3/0635* (2013.01)

(58) Field of Classification Search
    CPC ............... H01L 29/783; H01L 29/7839; H01L 29/78391; H01L 27/11; H01L 27/115; H01L 27/1159
    USPC ........................................................ 257/295
    See application file for complete search history.

(56) References Cited

U.S. PATENT DOCUMENTS

| | | |
|---|---|---|
| 2004/0238862 A1 | 12/2004 | Ichimori |
| 2017/0345831 A1 | 11/2017 | Chavan et al. |
| 2017/0365719 A1 | 12/2017 | Chen et al. |
| 2018/0082729 A1 | 3/2018 | Slesazeck et al. |

OTHER PUBLICATIONS

C.-Y. Chang et al. IEDM (2017) 2302 Energy-Efficient HfAlOx NCFET, Using Gate Strain and Defect Passivation to Realize Nearly Hysteresis-Free Sub-25mVd.

S. Dunkel et al. IEDM (2017) 1907 a FeFET based super-low-power ultra-fast embedded NVM technology for 22nm FDSOI and beyond.

\* cited by examiner

< Ferro >

< Ferro + Anti-ferro >

< Dielectric >

ELECTRONIC DEVICE AND METHOD OF MANUFACTURING THE SAME

CROSS-REFERENCE TO RELATED APPLICATION

This application claims the benefit of Korean Patent Application No. 10-2018-0096827, filed on Aug. 20, 2018, in the Korean Intellectual Property Office, the disclosure of which is incorporated herein in its entirety by reference.

BACKGROUND

1. Field

The present disclosure relates to electronic devices and methods of manufacturing the same.

2. Description of the Related Art

The architecture of existing silicon-based devices includes a central processing unit (CPU) chip and a separate main memory. The CPU chip includes a cache memory including static random access memory (SRAM), an arithmetic logic unit (ALU) for calculation, and a control unit for control. The main memory mainly includes dynamic random access memory (DRAM), and data transfer is performed between the control unit and the cache memory of the CPU chip.

However, such a structure in which the main memory and a logic device are separated from each other requires a plurality of different chips, which is disadvantageous in terms of cost. In addition, in an application field where the amount of data transferred between the main memory and a processor is large and data transfer is continuous, the structure is inefficient in terms of architecture and power consumption is large.

SUMMARY

Provided is an electronic device configuration having reduced manufacturing costs, increased efficiency, and/or reduced power consumption in terms of architecture.

Provided is an electronic device configuration in which a logic device portion and a memory device portion are monolithically integrated in one substrate/chip.

Provided is a method of manufacturing the electronic device.

Additional aspects will be set forth in part in the description which follows and, in part, will be apparent from the description, or may be learned by practice of the presented embodiments.

According to an aspect of at least one example embodiment, an electronic device includes a substrate; a first device on a first region of the substrate; and a second device on a second region of the substrate, wherein the first device includes a first gate electrode apart from the substrate; and a first domain layer including a ferroelectric domain between the substrate and the first gate electrode, and the second device includes a second gate electrode apart from the substrate; and a second domain layer including a ferroelectric domain between the substrate and the second gate electrode, wherein the first domain layer and the second domain layer have different characteristics from each other at a polarization change according to an electric field.

The first domain layer may have substantially a non-hysteretic behavior characteristic at the polarization change according to the electric field, and the second domain layer may have a hysteretic behavior characteristic at the polarization change according to the electric field.

The first domain layer may be a non-memory element and the first device may be a logic device, and the second domain layer may be a memory element and the second device may be a memory device.

The first domain layer may include a ferroelectric material region and an anti-ferroelectric material region, and the second domain layer may include a ferroelectric layer or a ferroelectric dominant material composition.

The first domain layer may include a ferroelectric material region and an anti-ferroelectric material region, and the ferroelectric material region and the anti-ferroelectric material region may have different crystalline phases.

The ferroelectric material region may have an orthorhombic crystalline phase, and the anti-ferroelectric material region may have a tetragonal crystalline phase.

The first domain layer and the second domain layer may include an identical base material.

The first domain layer and the second domain layer may have different doping concentrations.

At least one of the first domain layer and the second domain layer may include at least one of an Hf-based oxide or a Zr-based oxide.

At least one of the first domain layer and the second domain layer may include a dopant, and the dopant may include at least one of silicon (Si), aluminum (Al), zirconium (Zr), yttrium (Y), lanthanum (La), gadolinium (Gd), strontium (Sr), and hafnium (Hf).

The first device may further include a first channel, and a first source and a first drain both connected thereto and the first domain layer and the first gate electrode may be sequentially arranged on the first channel, and the second device may further include a second channel and a second source and a second drain both connected thereto and the second domain layer and the second gate electrode may be sequentially arranged on the second channel.

The first domain layer may be in direct contact with the first channel, and the second domain layer may be in direct contact with the second channel.

The electronic device may further include at least one of a first dielectric layer between the first channel and the first domain layer; and a second dielectric layer between the second channel and the second domain layer.

The electronic device may further include at least one of a first conductive layer between the first dielectric layer and the first domain layer; and a second conductive layer between the second dielectric layer and the second domain layer.

At least one of the first channel element and the second channel element may include at least one of Si, germanium (Ge), SiGe, a III-V group semiconductor, an oxide semiconductor, a nitride semiconductor, an oxynitride semiconductor, a two-dimensional (2D) material, a quantum dot, and an organic semiconductor.

The electronic device may further include a memory; an arithmetic logic unit (ALU); and a controller, wherein the memory, the ALU and the controller may be monolithically integrated on the substrate, and each of the ALU and the controller may include the first device, and the memory unit may include the second device.

The electronic device may include a neuromorphic device.

According to an aspect of at least one example embodiment, a method of manufacturing an electronic device includes: forming a first stack in which a first amorphous thin film and a first gate electrode for a first device are sequentially stacked on a first region of a substrate and a second stack in which a second amorphous thin film and a second gate electrode for a second device are sequentially stacked on a second region of the substrate; annealing the first amorphous thin film to form a first domain layer including a ferroelectric domain from the first amorphous thin film; and annealing the second amorphous thin film to form a second domain layer including a ferroelectric domain from the second amorphous thin film, wherein the first domain layer and the second domain layer have different characteristics from each other at a polarization change according to an electric field.

The first amorphous thin film and the second amorphous thin film may include an identical base material, and the annealing of the first amorphous thin film and the annealing of the second amorphous thin film may be performed under different conditions.

The first amorphous thin film and the second amorphous thin film may include different doping materials or have different doping concentrations, and the annealing of the first amorphous thin film and the annealing of the second amorphous thin film may be performed under identical conditions.

The first domain layer may include a ferroelectric material region and an anti-ferroelectric material region, and the second domain layer may include a ferroelectric layer or a ferroelectric dominant material composition.

The method may further include forming a first channel, and a first source and a first drain both connected to the first channel in a first region of the substrate; and forming a second channel and a second source and a second drain both connected to the second channel in a second region of the substrate.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
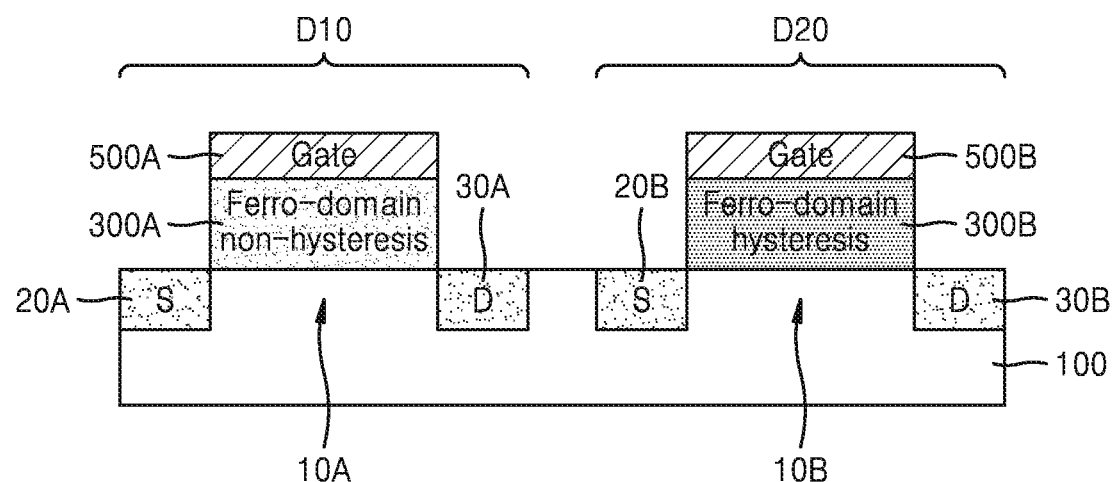
FIG. 1 is a cross-sectional view of an electronic device according to at least one example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, an electronic device and a method of manufacturing the same according to various embodiments will be described with reference to the accompanying drawings. The width and thickness of layers or elements illustrated in the accompanying drawings may be somewhat exaggerated for convenience and clarity of description. Like reference numerals refer to like elements throughout the detailed description.

FIG. 1 is a cross-sectional view of an electronic device according to at least one example embodiment.

Referring to FIG. 1, the electronic device may include a first device D10 that may be provided on/in a first region of a substrate 100, and a second device D20 that may be provided on/in a second region different from the first region. The first device D10 and the second device D20 may have different characteristics.

The first device D10 may include a first gate electrode 500A spaced apart from the substrate 100 and a first domain layer 300A including a ferroelectric domain between the substrate 100 and the first gate electrode 500A. The first domain layer 300A and the first gate electrode 500A may be regarded as constituting a 'first gate stack'. The second device D20 may include a second gate electrode 500B spaced apart from the substrate 100 and a second domain layer 300B including a ferroelectric domain between the substrate 100 and the second gate electrode 500B. The second domain layer 300B and the second gate electrode 500B may be regarded as constituting a 'second gate stack'.

The first domain layer 300A and the second domain layer 300B may have different characteristics from each other at a polarization change according to an electric field. In this regard, a material structure of the first domain layer 300A and a material structure of the second domain layer 300B may be different from each other. During a change of polarization according to the electric field, the first domain layer 300A may have substantially non-hysteretic behavior characteristics and the second domain layer 300B may have hysteretic behavior characteristics. The first domain layer 300A may be a non-memory element, and the first device D10 may be a logic device (a logic switching device). The logic device may be a logic transistor. The second domain layer 300B may be a memory element, and the second device D20 may be a memory device. For example, the first domain layer 300A may include a ferroelectric material region and an anti-ferroelectric material region, and the second domain layer 300B may include a ferroelectric layer or a ferroelectric dominant material composition. This will be described later below in more detail.

The first device D10 may further include a first channel 10A and a first source 20A and a first drain 30A both connected to the first channel 10A and the first domain layer 300A and the first gate electrode 500A may be sequentially arranged on the first channel element 10A. The second device D20 may further include a second channel 10B and a second source 20B and a second drain 30B both connected to the second channel element 10B and the second domain layer 300B and the second gate electrode 500B may be sequentially arranged on the second channel element 10B. The first and second channel elements 10A and 10B, the first and second sources 20A and 20B, and the first and second drains 30A and 30B may be provided in the substrate 100. The first and second sources 20A and 20B and the first and second drains 30A and 30B may be formed by implanting impurities into different regions of the substrate 100. A region of the substrate 100 between the first source 20B and the second drain 30A may be defined as the first channel (channel region) 10A and a region of the substrate 100 between the second source 20B and the second drain 30B may be defined as the second channel (channel region) 10B. The substrate 100 may be, for example, a silicon (Si) substrate. In another example, the substrate 100 may be a substrate including a material other than Si, for example, germanium (Ge), silicon-germanium (SiGe), a III-V semiconductor, or the like. In this case, the channels 10A and 10B may include Si, Ge, SiGe or a III-V semiconductor. The material of the substrate 100 is not limited to those described above and may vary. In addition, the channels 10A and 10B may be provided as a separate material layer (thin film) from the substrate 100, not as a part of the substrate 100. In at least one example embodiment, a material composition of the channels 10A and 10B may vary. For example, the channels 10A and 10B may include at least one of an oxide semiconductor, a nitride semiconductor, an oxynitride semiconductor, a two-dimensional (2D) material, a quantum dot, and an organic semiconductor. The oxide semiconductor may include, for example, InGaZnO or the like, and the 2D material may include, for example, transition metal dichalcogenide (TMD) or graphene, and the quantum dot may include a colloidal quantum dot (QD), a nanocrystal structure, or the like. However, these are merely examples and embodiments are not limited thereto.

The first domain layer 300A may include a ferroelectric material region and an anti-ferroelectric material region. Further, according to a combination of the ferroelectric material region and the anti-ferroelectric material region, the first domain layer 300A may have substantially a non-hysteretic behavior characteristic at a polarization change according to an electric field. The second domain layer 300B may include a ferroelectric layer or a ferroelectric dominant material composition, and may have a hysteretic behavior characteristic at a polarization change according to an electric field.

Figure 2:
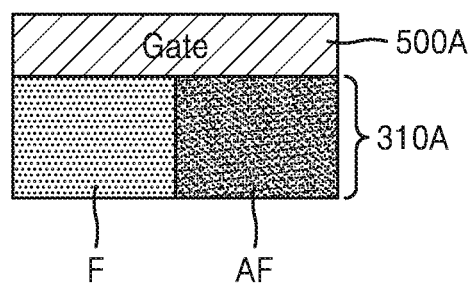
FIG. 2 is a cross-sectional view of a stack structure of a first domain layer and a first gate electrode applicable to a first device of an electronic device according to at least one example embodiment.

FIG. 2 is a cross-sectional view of a stack structure of a first domain layer and a first gate electrode applicable to a first device of an electronic device according to at least one example embodiment.

Referring to FIG. 2, a first domain layer 310A may be provided under the first gate electrode 500A. The first domain layer 310A may include a ferroelectric material region F including a ferroelectric domain and an anti-ferroelectric material region AF including an anti-ferroelectric domain. According to a combination of the ferroelectric material region F and the anti-ferroelectric material region AF, the first domain layer 310A may have substantially a non-hysteretic behavior characteristic at a polarization change according to an electric field. In other words, the first domain layer 310A may have substantially no hysteresis characteristic.

A ferroelectric material has a spontaneous dipole (electric dipole), that is, spontaneous polarization because charge distribution in a unit cell is non-centrosymmetric in a crystallized material structure. The ferroelectric material has remnant polarization due to a dipole even in the absence of an external electric field. In addition, the polarization direction of the ferroelectric material may be switched in domain units by applying an external electric field to the ferroelectric material.

An anti-ferroelectric material may include an array of electrical dipoles, but the remnant polarization may be zero or close to zero. In the absence of an electric field, the directions of adjacent dipoles are opposite each other and the polarization thereof cancel each other so that the overall spontaneous polarization and remnant polarization of the anti-ferroelectric material may be zero or close to zero. However, the anti-ferroelectric material may exhibit a polarization characteristic and a switching characteristic when an external electric field is applied thereto.

In at least one example embodiment, the first domain layer 310A may have no hysteresis characteristic by performing capacitance matching using a combination of at least one ferroelectric material region F and at least one anti-ferroelectric material region AF that are in contact with each other. Therefore, domain switching occurs in each of the ferroelectric material region F and at least one anti-ferroelectric material region AF and a switching characteristic of the first device D10 (of FIG. 1) (logic device) may be improved by voltage amplification occurring during the domain switching. In particular, an effect of further lowering a subthreshold swing (SS) value of the first device D10 (logic device) may be obtained. Since the first domain layer 310A has a non-hysteretic behavior characteristic, an excellent switching element with an ON/OFF non-memory characteristic may be obtained.

In addition, in the example embodiment of FIG. 1, the first domain layer 300A may be in direct contact with the first channel element 10A. In the example embodiment, a separate dielectric layer need not be used between the first channel element 10A and the first domain layer 300A, and characteristics deterioration due to a dielectric layer having a low dielectric constant may be reduced or prevented.

FIG. 2 shows a case where the ferroelectric material region F and the anti-ferroelectric material region AF of the first domain layer 300A are arranged in a direction parallel to the first gate electrode 500A, that is, the ferroelectric material region F and the anti-ferroelectric material region AF are laterally arranged. However, according to at least one example embodiment, the ferroelectric material region F and the anti-ferroelectric material region AF may have a structure arranged in a direction perpendicular to the first gate electrode 500A, that is, a structure vertically arranged. Examples thereof are shown in FIGS. 3 and 4.

Figure 3:
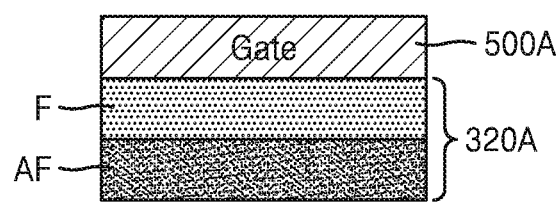
FIGS. 3 and 4 are cross-sectional views of a stack structure of a first domain layer and a first gate electrode applicable to a first device of an electronic device according to at least one example embodiment.
Figure 4:
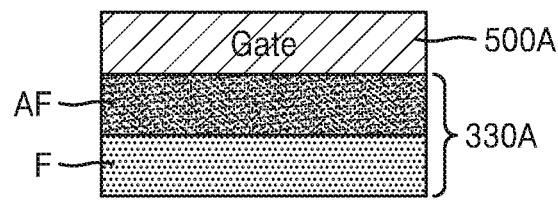

FIGS. 3 and 4 are cross-sectional views of a stack structure of a first domain layer and a first gate electrode applicable to a first device of an electronic device according to at least one example embodiment.

Referring to FIGS. 3 and 4, first domain layers 320A and 330A may each include at least one ferroelectric material region F and at least one anti-ferroelectric material region AF arranged in a direction perpendicular to the first gate electrode 500A. In FIG. 3, the ferroelectric material region F is in contact with the first gate electrode 500A, and the anti-ferroelectric material region AF is provided under the ferroelectric material region F. In FIG. 4, the anti-ferroelectric material region AF is in contact with the first gate electrode 500A, and the ferroelectric material region F is provided under the anti-ferroelectric material region AF. The first domain layers 320A and 330A of FIGS. 3 and 4 may be applied instead of the first domain layer 300A of FIG. 1. Even in the structures of FIGS. 3 and 4, capacitance matching is performed by the combination of the ferroelectric material region F and the anti-ferroelectric material region AF, so that the first domain layers 320A and 330A may not have hysteresis characteristics.

Although FIG. 1 illustrates the case where the first and second domain layers 300A and 300B are in direct contact with the first and second channels 10A and 10B respectively, the lower structure under the first and second domain layers 300A and 300B may be different. Examples thereof are shown in FIGS. 5 and 6.

Figure 5:
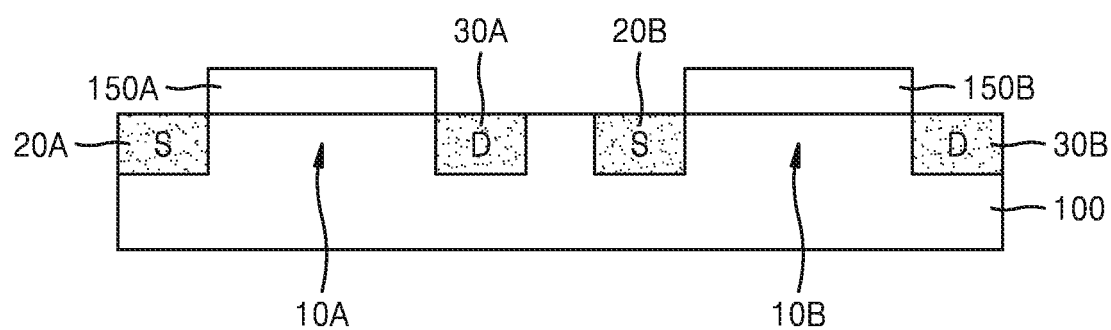
FIG. 5 is a cross-sectional view of a lower structure applicable under first and second domain layers of an electronic device according to at least one example embodiment.

FIG. 5 is a cross-sectional view of a lower structure applicable under first and second domain layers of an electronic device according to at least one example embodiment.

Referring to FIG. 5, a first dielectric layer 150A and a second dielectric layer 150B may be provided on the first channel element 10A and the second channel element 10B, respectively. The first domain layers 300A to 330A and the first gate electrode 500A of FIGS. 1 to 4 may be arranged on the first dielectric layer 150A. Second domain layers 300B to 330B and the second gate electrode 500B of FIGS. 1 to 4 may be arranged on the second dielectric layer 150B. The first and second dielectric layers 150A and 150B may be as thin as about 5 nm or less, but is not limited thereto and may have a thickness of 5 nm or more. For the first and second dielectric layers 150A and 150B, for example, a Si oxide, an Al oxide, a Hf oxide, a Zr oxide, or the like may be applied, or a 2D insulator such as hexagonal boron nitride (h-BN) may be used. However, the material of the first and second dielectric layers 150A and 150B may vary without being limited thereto. The first and second dielectric layers 150A and 150B may all be insulating layers. Accordingly, a dielectric material having a relatively high dielectric constant may be easily applied to the first dielectric layer 150A because capacitance matching is performed using the ferroelectric material region F and the anti-ferroelectric material region AF in the first device D10 (of FIG. 1). The higher an dielectric constant of the first dielectric layer 150A, the better the performance of the first device D10. Further, when the first and second dielectric layers 150A and 150B are used, an effect of suppressing or preventing electrical leakage may be obtained. In some cases, any one of the first and second dielectric layers 150A and 150B may not be provided.

Figure 6:
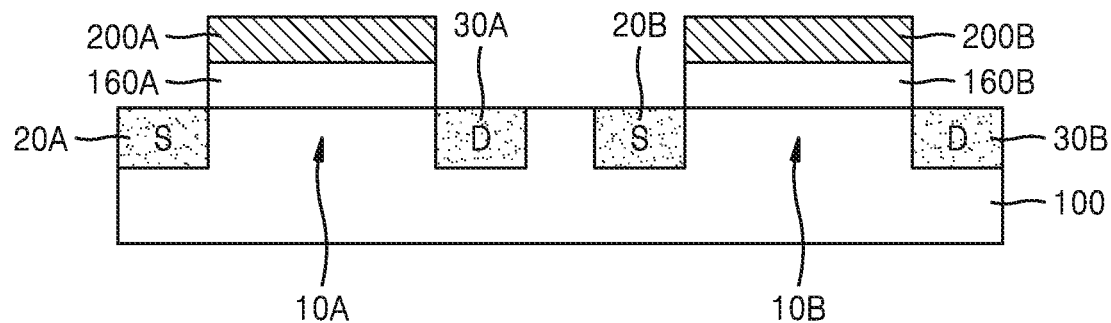
FIG. 6 is a cross-sectional view of a lower structure applicable under first and second domain layers of an electronic device according to at least one example embodiment.

FIG. 6 is a cross-sectional view of a lower structure applicable under first and second domain layers of an electronic device according to at least one example embodiment.

Referring to FIG. 6, a first dielectric layer 160A may be provided on the first channel 10A and a first conductive layer 200A may further be provided on the first dielectric layer 160A. A second dielectric layer 160B may be provided on the second channel 10B and a second conductive layer 200B may further be provided on the second dielectric layer 160B. The first domain layers 300A to 330A and the first gate electrode 500A of FIGS. 1 to 4 may be arranged on the first conductive layer 200A. The second domain layers 300B to 330B and the second gate electrode 500B of FIGS. 1 to 4 may be arranged on the second conductive layer 200B. Materials of the first and second dielectric layers 160A and 160B may be the same or similar to materials of the dielectric layers 150A and 150B of FIG. 5. The first and second conductive layers 200A and 200B may be formed of a metal or a metal compound. The first and second conductive layers 200A and 200B may be floating electrodes and may be involved in manufacturing processes or characteristics control of the domain layers 300A to 330A and 300B to 330B. The first and second dielectric layers 160A and 160B may insulate the channel element 10 from the first and second conductive layers 200A and 200B, respectively, and may have a thickness of, for example, about 10 nm or more. In some cases, any one of a combination of the first dielectric layer 160A and the first conductive layer 200A and a combination of the second dielectric layer 160B and the second conductive layer 200B may not be provided.

FIG. 2 shows the case where the first domain layer 310A includes one ferroelectric material region F and one anti-ferroelectric material region AF. However, according to at least one example embodiment, a plurality of ferroelectric material regions F and a plurality of anti-ferroelectric material regions AF may constitute one first domain layer 310A. An example thereof is shown in FIG. 7.

Figure 7:
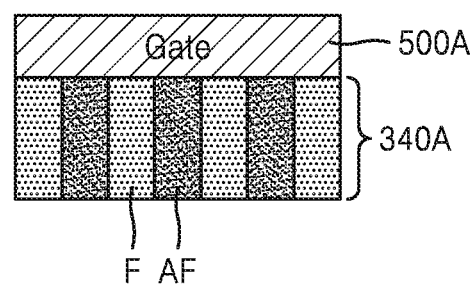
FIG. 7 is a cross-sectional view of a stack structure of a first domain layer and a first gate electrode applicable to a first device of an electronic device according to at least one example embodiment.

FIG. 7 is a cross-sectional view of a stack structure of a first domain layer and a first gate electrode applicable to a first device of an electronic device according to another embodiment.

Referring to FIG. 7, a first domain layer 340A may have a structure in which a plurality of ferroelectric material regions F and a plurality of anti-ferroelectric material regions AF are alternately arranged in a horizontal direction (laterally). The ratio and size of the ferroelectric material regions F and the anti-ferroelectric material regions AF are illustrative and may vary.

According to at least one example embodiment, a first domain layer may include a combination of a structure including at least one ferroelectric material region and at least one anti-ferroelectric material region that are arranged in a direction parallel to a first gate electrode and a structure including at least one ferroelectric material region and at least one anti-ferroelectric material region arranged in a direction perpendicular to the first gate electrode. An example thereof is shown in FIG. 8.

Figure 8:
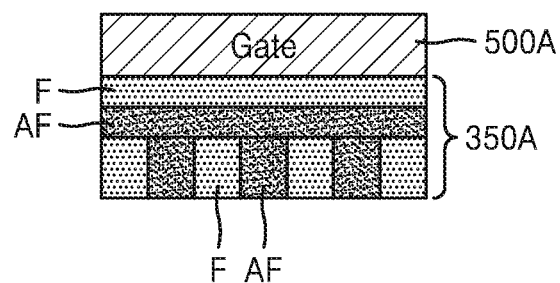
FIG. 8 is a cross-sectional view of a stack structure of a first domain layer and a first gate electrode applicable to a first device of an electronic device according to at least one example embodiment.

FIG. 8 is a cross-sectional view of a stack structure of a first domain layer and a first gate electrode applicable to a first device of an electronic device according to at least one example embodiment.

Referring to FIG. 8, a first domain layer 350A may include a combination of a structure including a plurality of ferroelectric material regions F and a plurality of anti-ferroelectric material regions AF that are arranged in a horizontal direction (laterally) and a structure in which the plurality of ferroelectric material regions F and the plurality of anti-ferroelectric material regions AF are arranged in a vertical direction (vertically). Depending on the conditions of a manufacturing process, a combination of such arrangements may be formed. However, the structure of FIG. 8 is illustrative and may vary.

In the above example embodiments, the ferroelectric material region F and the anti-ferroelectric material region AF may include an identical base material, but may have different crystalline phases. The ferroelectric material region F and the anti-ferroelectric material region AF may include an identical material and may have different crystalline phases so that the ferroelectric material region F may exhibit a ferroelectric property and the anti-ferroelectric material region AF may exhibit an anti-ferroelectric property. For example, the ferroelectric material region F may have an orthorhombic crystalline phase, and the anti-ferroelectric material region AF may have a tetragonal crystalline phase. For example, the ferroelectric material region F and the anti-ferroelectric material region AF may include a Hf-based oxide or a Zr-based oxide. For example, an HfO-based amorphous thin film is formed and then, through annealing (heat treatment) control, a part thereof may be made into the ferroelectric material region F having an orthorhombic crystalline phase and another part thereof may be made into the anti-ferroelectric material region AF having a tetragonal crystal phase.

The ferroelectric material region F and the anti-ferroelectric material region AF may be formed by controlling doping concentration or a dopant differently as well as the annealing (annealing) control. For example, a part of the HfO-based amorphous thin film may have a first doping concentration and the other part may have a second doping concentration and, by annealing (heat-treating) them under a certain condition, a region having the first doping concentration may be made into the ferroelectric material region F and a region having the second doping concentration may be made into the anti-ferroelectric material region AF. This effect may be obtained by using a different dopant instead of the doping concentration. Accordingly, in some cases, the ferroelectric material region F and the anti-ferroelectric material region AF may have different doping concentrations, and/or may include different dopants. When at least one of the ferroelectric material region F and the anti-ferroelectric material region AF includes a dopant, the dopant may include at least one of silicon (Si), aluminum (Al), zirconium (Zr), yttrium (Y), lanthanum (La), gadolinium (Gd), strontium (Sr), and hafnium (Hf).

In at least one example embodiment, the ferroelectric material region F and the anti-ferroelectric material region AF may have different base materials.

In the above embodiments, a volume ratio (vol %) of the ferroelectric material region F to the anti-ferroelectric material region AF in the first domain layers 300A to 350A may be determined within a range from about 0.1:99.9 to about 99.9:0.1. For example, the vol % of the ferroelectric material region F and the anti-ferroelectric material region AF in the first domain layers 300A to 350A may be determined within a range from about 10:90 to about 90:10. The vol % may be determined such that the first domain layers 300A to 350A satisfy conditions that substantially do not have hysteresis characteristics.

Figure 9:
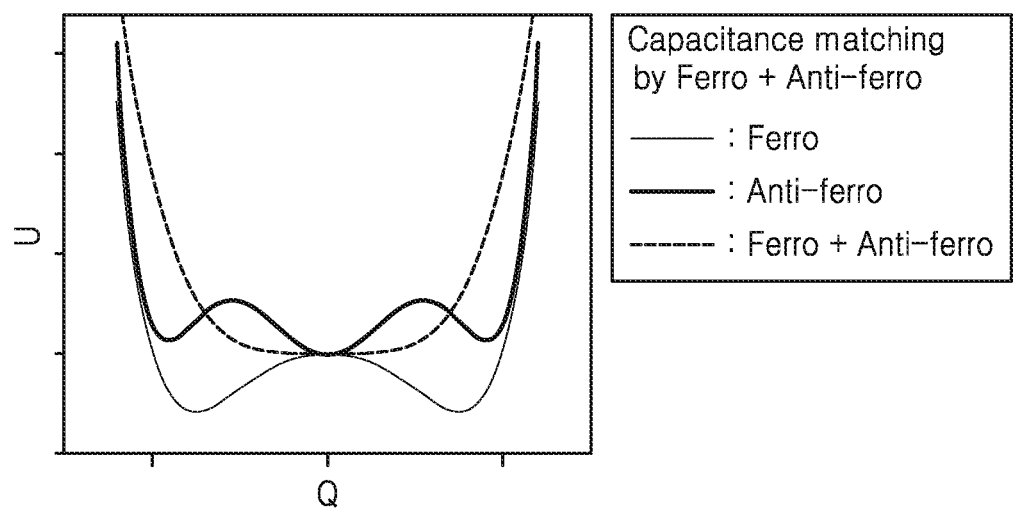
FIG. 9 is a graph illustrating an example of capacitance matching using a ferroelectric and an anti-ferroelectric in forming a first domain layer, according to at least one example embodiment.

FIG. 9 is a graph illustrating an example of capacitance matching using a ferroelectric and an anti-ferroelectric in forming a first domain layer, according to at least one example embodiment. In FIG. 9, an X axis represents a charge (Q) of a corresponding material and a Y axis represents an energy (U) of a corresponding material.

Referring to FIG. 9, the graph of a ferroelectric material (Ferro) has a well shape on both the left and right sides. The two well shapes correspond to two stable polarization states, and this graph shape represents a hysteresis behavior. There is a point in a transition region between the two wells that has a negative capacitance. Since a first device according to at least one example embodiment includes a ferroelectric and utilizes a negative capacitance effect of the ferroelectric, in this respect, the first device may be regarded as a switching device (logic switching device) using the negative capacitance effect.

The graph of an anti-ferroelectric (Anti-ferro) has a different curvature from the graph of the ferroelectric (Ferro). When the ferroelectric and the anti-ferroelectric are appropriately mixed and designed, a combination (Ferro+Anti-ferro) of the ferroelectric and the anti-ferroelectric is designed to be a U-shaped graph rather than a two-well type, and does not exhibit a substantially hysteresis behavior. In other words, capacitance matching using the ferroelectric and the anti-ferroelectric results in elimination of hysteresis.

When the first domain layer contacts a first channel, the capacitance matching described above may be performed in consideration of a capacitance of the first channel. Furthermore, the capacitance matching may be performed in consideration of a parasitic capacitance between the first channel and first source and first drain. When the first domain layer contacts a first dielectric layer, the capacitance matching described above may be performed in consideration of a capacitance of the first dielectric layer. As a result, the first domain layer may not have hysteresis by the capacitance matching.

When the first domain layer and the first channel are in contact with each other and the capacitance matching is performed in consideration of the capacitance of the first channel, it can be said that a combination of the first domain layer and the first channel region has no hysteresis. Alternatively, in a state where the first domain layer and the first channel are in contact with each other, it can be said that the first domain layer has no hysteresis. Similarly, when the first domain layer and the first dielectric layer are in contact with each other and the capacitance matching is performed in consideration of the capacitance of the first dielectric layer, a combination of the first domain layer and the first dielectric layer has no hysteresis. Alternatively, when the first domain layer and the first dielectric layer are in contact with each other, the first domain layer has no hysteresis.

Figure 10:
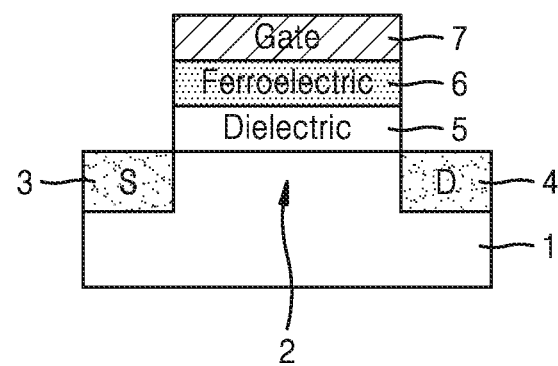
FIG. 10 is a cross-sectional view of a configuration of another device.

FIG. 10 is a cross-sectional view of a configuration of another device.

Referring to FIG. 10, a substrate 1 may be provided with a channel 2, a source 3, and a drain 4. A dielectric layer 5 may be on the channel 2, a ferroelectric layer 6 may be on the dielectric layer 5, and a gate electrode 7 may be on the ferroelectric layer 6. The ferroelectric layer 6 may be provided between the channel 2 and the gate electrode 7 and the dielectric layer 5 may be provided between the ferroelectric layer 6 and the channel 2. This device shows a case where capacitance matching is performed using the ferroelectric layer 6 and the dielectric layer 5.

Figure 11:
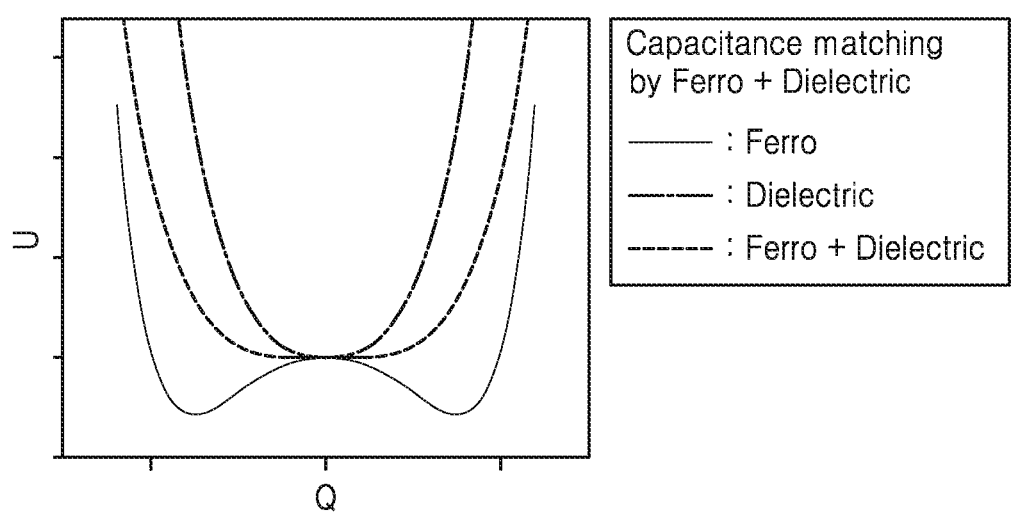
FIG. 11 is a graph illustrating capacitance matching using a ferroelectric and a dielectric in a device structure of FIG. 10.

FIG. 11 is a graph illustrating capacitance matching using a ferroelectric and a dielectric in a device structure of FIG. 10.

Referring to FIG. 11, the ferroelectric (Ferro) has the shape of a graph as described with reference to FIG. 9. The dielectric (Dielectric) has a shape of a relatively narrow U-shaped graph. When the ferroelectric and the dielectric are combined (Ferro+Dielectric), hysteresis is eliminated by capacitance matching, and a U-shaped graph having a relatively wide width is obtained.

As described in FIG. 9, in at least one example embodiment, a first domain layer may be formed by performing capacitance matching using a ferroelectric and an anti-ferroelectric. However, in some cases, as shown in FIGS. 10 and 11, the capacitance matching may be performed using a ferroelectric and a dielectric. In the latter case, a first dielectric layer may be interposed between the first channel element 10A and the first domain layer 300A in FIG. 1 to perform capacitance matching by the first domain layer 300A and a first dielectric layer. The first domain layer 300A may be a ferroelectric. Therefore, even if the first domain layer 300A does not include an anti-ferroelectric, hysteresis of the first domain layer 300A may be eliminated by performing capacitance matching. However, when capacitance matching is performed using an anti-ferroelectric, it may be more advantageous to improve the performance of a first device.

Figure 12A:
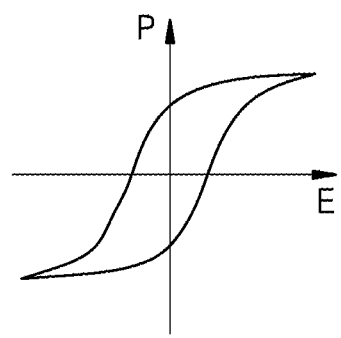
FIGS. 12A to 15B are graphs showing characteristics of a ferroelectric, an anti-ferroelectric, a combination of the ferroelectric and the anti-ferroelectric, and a dielectric, respectively.
Figure 12B:
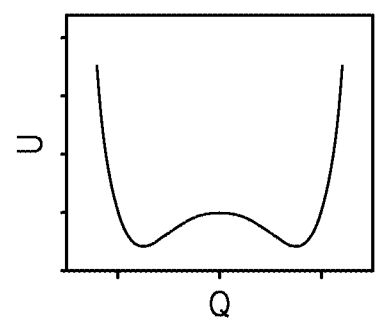
Figure 13A:
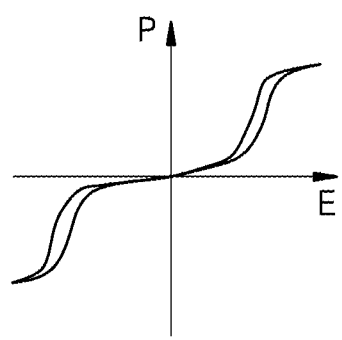
Figure 13B:
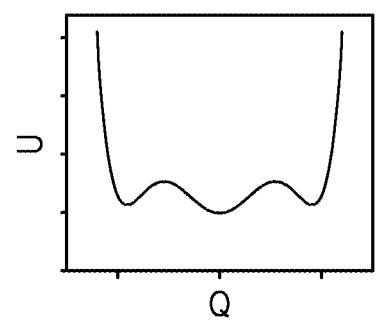
Figure 14A:
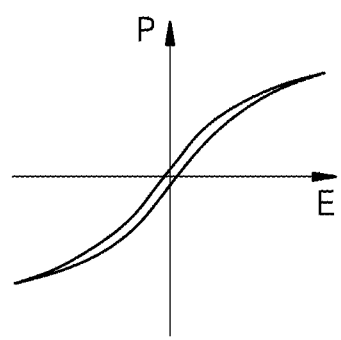
Figure 14B:
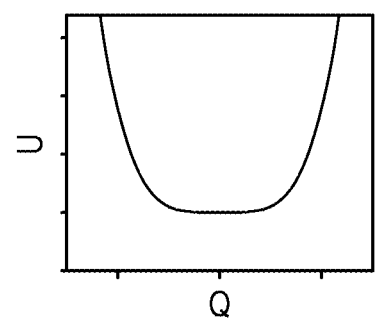
Figure 15A:
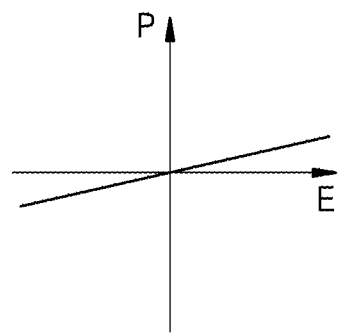
Figure 15B:
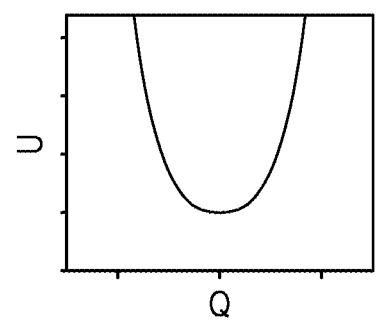

FIGS. 12A to 15B are graphs showing characteristics of a ferroelectric, an anti-ferroelectric, a combination of the ferroelectric and the anti-ferroelectric, and a dielectric, respectively. In each of FIGS. 12A to 15B, graph A shows a relationship between an electric field E and polarization P applied to a corresponding material layer, and graph B shows a relationship between a charge Q and an energy U of the corresponding material layer. In particular, FIGS. 14A and 14B may correspond to a characteristic of the combination (mixture) of the ferroelectric and the anti-ferroelectric applicable to a first domain layer of an electronic device according to at least one example embodiment. The characteristic of such a first domain layer may be suitable for a logic device. FIGS. 12A and 12B may correspond to a characteristic of the ferroelectric or a ferroelectric dominant material applicable to a second domain layer of the electronic device according to the embodiment. A characteristic of the second domain layer may be suitable for a memory device.

The first domain layer 300A and the second domain layer 300B of FIG. 1 may include an identical base material. For example, the first domain layer 300A and the second domain layer 300B may include at least one of a Hf-based oxide and a Zr-based oxide. The Hf-based oxide may be HfO or HfZrO. The Zr-based oxide may be ZrO or the like. Here, HfO, HfZrO, and ZrO are expressed by ignoring the composition ratio of constituent elements. If necessary, at least one of the first domain layer 300A and the second domain layer 300B may further include a dopant. The dopant may include at least one of Si, Al, Zr, Y, La, Gd, Sr, and Hf. The first domain layer 300A and the second domain layer 300B may have different doping concentrations or may include different doping materials (dopants). Since the first domain layer 300A and the second domain layer 300B may be formed from the identical base material, they may be easily formed on the identical substrate 100. However, in some cases, the first domain layer 300A and the second domain layer 300B may include different base materials.

Figure 16:
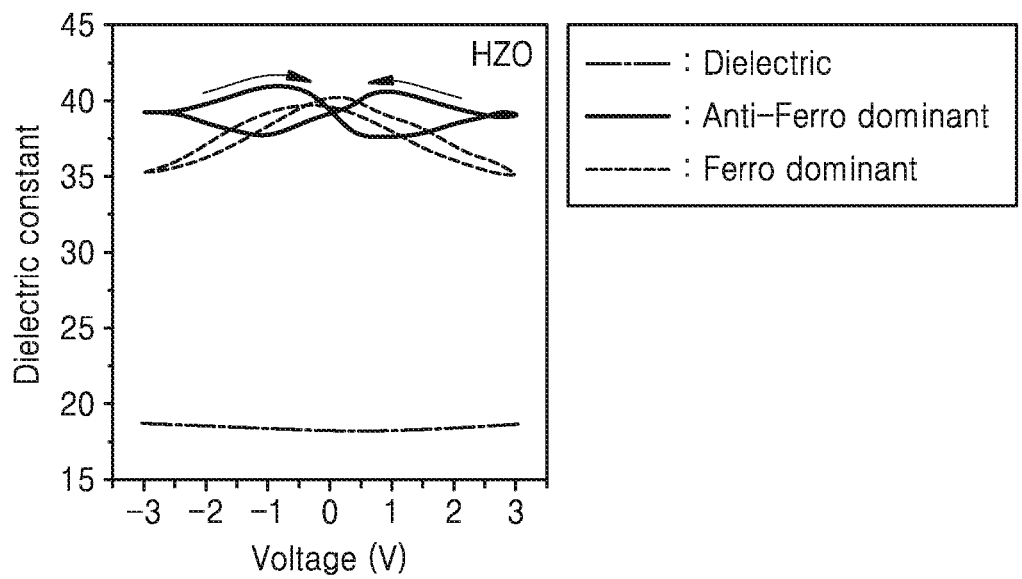
FIG. 16 is a graph showing a result of measuring dielectric constant-voltage characteristics of a metal/HfZrO layer/metal structure according to constitution/physical properties of the HfZrO layer, according to at least one example embodiment.

FIG. 16 is a graph showing a result of measuring dielectric constant-voltage characteristics of a metal/HfZrO layer/metal structure according to constitution/properties of the HfZrO layer, according to at least one example embodiment. FIG. 16 includes results when the HfZrO layer is a dielectric, when the HfZrO layer is in an anti-ferroelectric dominant state, and when the HfZrO layer is in a ferroelectric dominant state.

Referring to FIG. 16, the amorphous HfZrO layer that is not annealed (heat-treated) may exhibit a dielectric property, may exhibit an anti-ferroelectric dominant characteristic when an amorphous HfZrO layer is annealed under a first condition, and may exhibit a ferroelectric dominant characteristic when the amorphous HfZrO layer is annealed under a second condition. A ratio of the ferroelectric to the ferroelectric may be controlled in accordance with an annealing condition for an HfO thin film or an HfO-based thin film.

Figure 17:
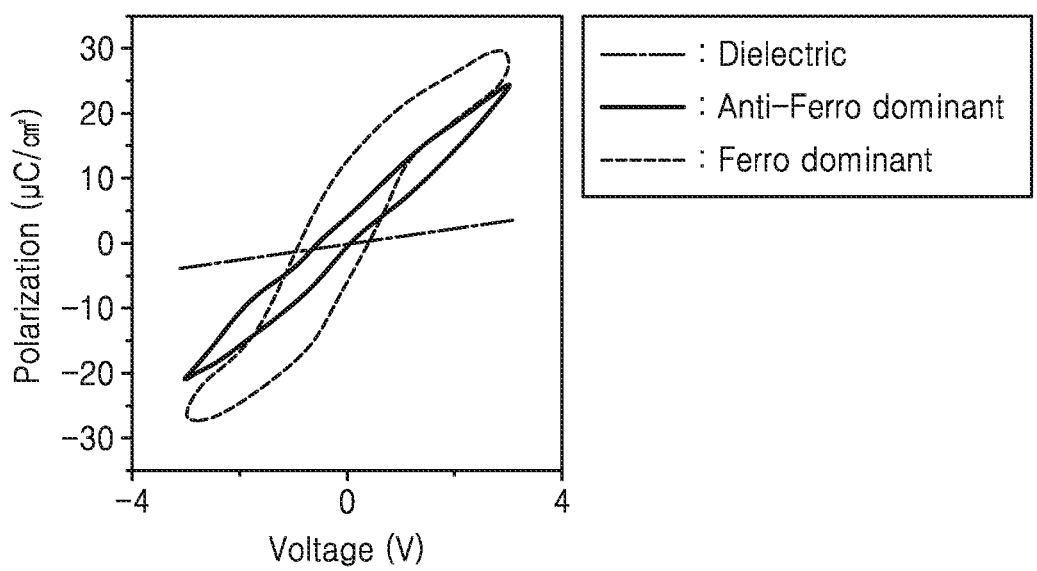
FIG. 17 is a graph showing a result of measuring polarization-voltage characteristics of the metal/HfZrO layer/metal structure described in FIG. 16, according to at least one example embodiment.

FIG. 17 is a graph showing a result of measuring polarization-voltage characteristics of the metal/HfZrO layer/metal structure described in FIG. 16, according to at least one example embodiment.

Referring to FIG. 17, remnant polarization is close to 0 and the hysteresis is also decreased in an anti-ferroelectric dominant state. However, the remnant polarization is increased to about 10 and the hysteresis is also increased in a ferroelectric dominant state.

Figure 18A:
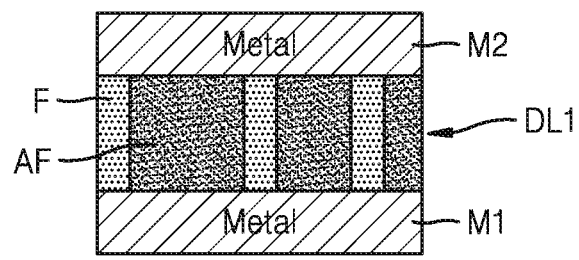
FIG. 18A is a cross-sectional view of an example of a configuration (domain arrangement) of a domain layer DL1 in an anti-ferroelectric dominant state.

FIG. 18A is a cross-sectional view of an example of a configuration (domain arrangement) of a domain layer DL1 in an anti-ferroelectric dominant state.

Figure 18B:
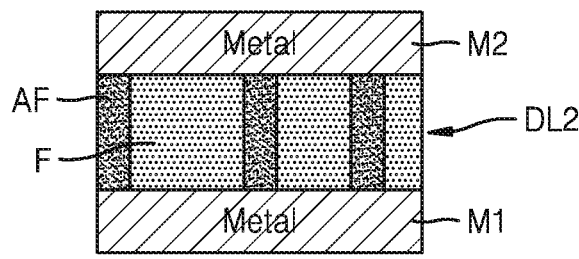
FIG. 18B is a cross-sectional view of an example of a configuration (domain arrangement) of a domain layer DL2 in a ferroelectric dominant state.

FIG. 18B is a cross-sectional view of an example of a configuration (domain arrangement) of a domain layer DL2 in a ferroelectric dominant state.

Referring to FIGS. 18A and 18B, the total volume of the anti-ferroelectric AF may be considerably greater than the total volume of the ferroelectric F in the domain layer DL1 in an anti-ferroelectric dominant state, and the total volume of the ferroelectric F may be considerably greater than the total volume of the anti-ferroelectric AF in the domain layer DL2 in the ferroelectric dominant state. Depending on an annealing condition, an orthorhombic crystal region with ferroelectric properties and a tetragonal crystal region with anti-ferroelectric properties may be mixed in a thin film. In FIGS. 18A and 18B, M1 and M2 denote metal layers.

Figure 19:
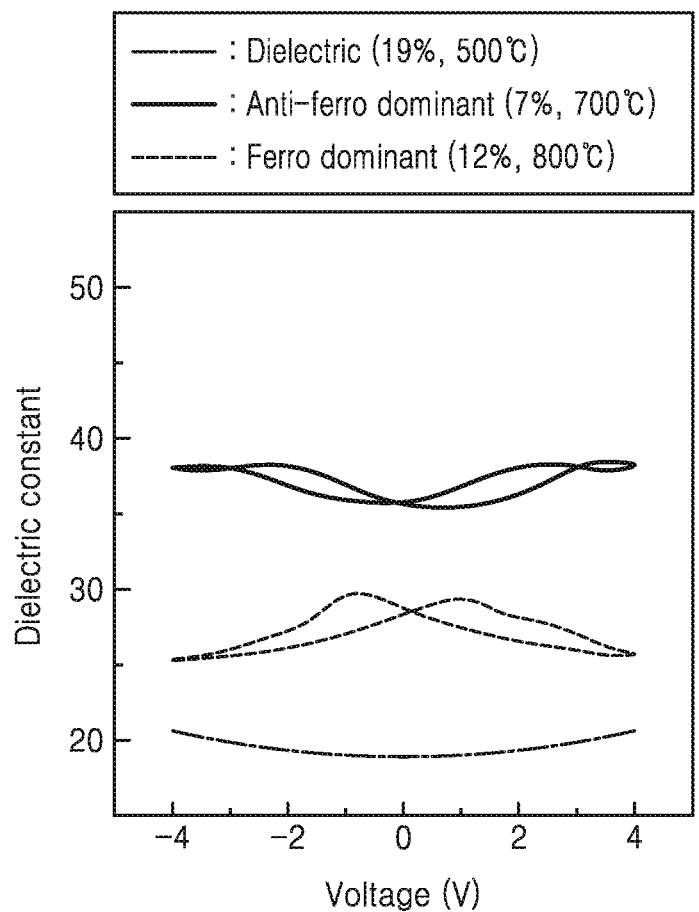
FIG. 19 is a graph showing dielectric constant-voltage characteristics of an Al:HfO thin film according to constitution/physical properties thereof, according to at least one example embodiment.

FIG. 19 is a graph showing a result of measuring dielectric constant-voltage characteristics of an Al:HfO thin film according to constitution/physical properties thereof, according to at least one example embodiment. FIG. 19 includes results when the Al:HfO thin film is a dielectric, when the Al:HfO thin film is in an anti-ferroelectric dominant state, and when the Al:HfO thin film is in a ferroelectric dominant state. The Al:HfO thin film represents an Al-doped HfO thin film.

Referring to FIG. 19, when a doping level of Al is 19 at % and an annealing temperature is 500° C., an Al:HfO thin film having a dielectric property may be obtained. When the doping level of Al is 7 at % and the annealing temperature is 700° C., an Al:HfO thin film having an anti-ferroelectric dominant property may be obtained. When the doping level of Al is 12 at % and the annealing temperature is 800° C., an Al:HfO thin film having a ferroelectric dominant property may be obtained. By adjusting the doping level of Al and/or the annealing condition for the amorphous Al:HfO thin film, the physical properties of the Al:HfO thin film may be changed.

Figure 20:
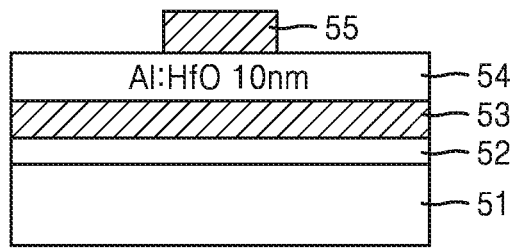
FIG. 20 is a cross-sectional view of a structure of a device used to obtain the result of FIG. 19.

FIG. 20 is a cross-sectional view of a structure of a device used to obtain the result of FIG. 19.

Referring to FIG. 20, a silicon oxide layer 52 may be formed on a silicon substrate 51, a first metal layer 53 may be formed on the silicon oxide layer 52, and an Al:HfO thin film 54 may be formed on the first metal layer 53. Next, a second metal layer 55 may be formed on the Al:HfO thin film 54. The first and second metal layers 53 and 55 may all be Mo layers, and a thickness of the Al:HfO thin film 54 may be about 10 nm. A width of the Al:HfO thin film 54 may be about 5 µm to about 400 µm.

The ferroelectric property and the anti-ferroelectric property of the Al:HfO thin film 54 may be controlled in accordance with the doping level and/or the annealing temperature of the Al:HfO thin film 54. That is, depending on the doping level and/or the annealing temperature of the Al:HfO thin film 54, the Al:HfO thin film 54 may have a dielectric property, an anti-ferroelectric dominant property, or a ferroelectric dominant property. Therefore, the ratio of a ferroelectric to an anti-ferroelectric formed in the Al:HfO thin film 54 may be controlled.

For example, characteristics changes according to the doping level and the annealing temperature may be summarized as shown in Table 1 below.

TABLE 1

|  | 7 at % | 12 at % | 19 at % | 22 at % |
| --- | --- | --- | --- | --- |
| 500° C. | D | D | D | D |
| 600° C. | F dominant | D | D | D |
| 700° C. | F dominant | D | D | D |
| 800° C. | F dominant | AF dominant | D | D |
| 900° C. | AF dominant | AF dominant | D | D |

In Table 1, D indicates dielectric properties, F dominant indicates a ferroelectric dominant characteristic, and AF dominant indicates an anti-ferroelectric dominant characteristic. Depending on the materials used and the degree of doping, an appropriate annealing temperature may vary. In this regard, an annealing temperature used in manufacturing an electronic device according to at least one example embodiment may be about 400° C. to about 1200° C.

Figure 21:
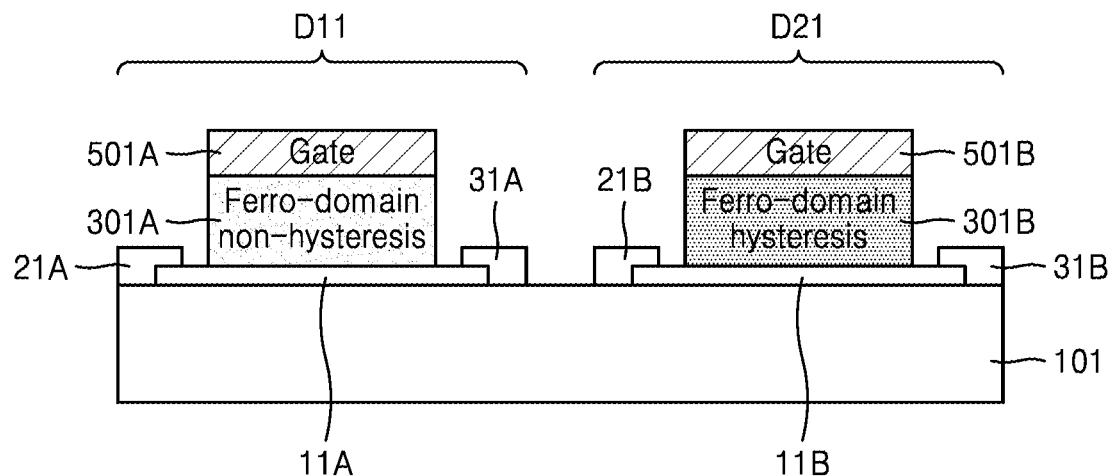
FIG. 21 is a cross-sectional view of an electronic device according to at least one example embodiment.

FIG. 21 is a cross-sectional view of an electronic device according to at least one example embodiment.

Referring to FIG. 21, the electronic device may include a substrate 101 and first and second channel layers 11A and 11B on the substrate 101. Each of the first and second channel layers 11A and 11B may be a material layer (thin film) which is not part of the substrate 101 and is separate from the substrate 101. The first and second channel layers 11A and 11B may include at least one of an oxide semiconductor, a nitride semiconductor, an oxynitride semiconductor, a 2D material, a quantum dot, and an organic semiconductor. The oxide semiconductor may include, for example, InGaZnO or the like, and the 2D material may include, for example, transition metal dichalcogenide (TMD) or graphene, and the quantum dot may include a colloidal quantum dot (QD), a nanocrystal structure, or the like. However, these are merely examples and example embodiments are not limited thereto.

The electronic device of FIG. 21 may further include the first source electrode 21A and the first drain electrode 31A that are electrically connected to different regions of a first channel layer 11A. The first source electrode 21A may be provided on a first end of the first channel layer 11A and the first drain electrode 31A may be provided on a second end of the first channel layer 11A. The electronic device may further include second source electrode 21B and second drain electrode 31B electrically connected to different regions of the second channel layer 11B. The second source electrode 21B may be provided on a first end of a second channel layer 11B and the second drain electrode 31B may be provided on a second end of the second channel layer 11B. The source electrodes 21A and 21B and the drain electrodes 31A and 31B may include a conductive material such as a metal, a metal compound, or a conductive polymer.

The electronic device of FIG. 21 may further include a first domain layer 301A provided on a region of the first channel layer 11A between the first source electrode 21A and the first drain electrode 31A. The first domain layer 301A may be the same as or similar to the first domain layer 300A described with reference to FIG. 1. A first gate electrode 501A may be provided on the first domain layer 301A. A second domain layer 301B may be provided on a region of the second channel layer 11B between the second source electrode 21B and the second drain electrode 31B. The second domain layer 301B may be the same as or similar to the second domain layer 300B described with reference to FIG. 1. A second gate electrode 501B may be provided on the second domain layer 301B. The device of FIG. 21 may be modified as described with reference to FIGS. 2 to 8.

Figure 22:
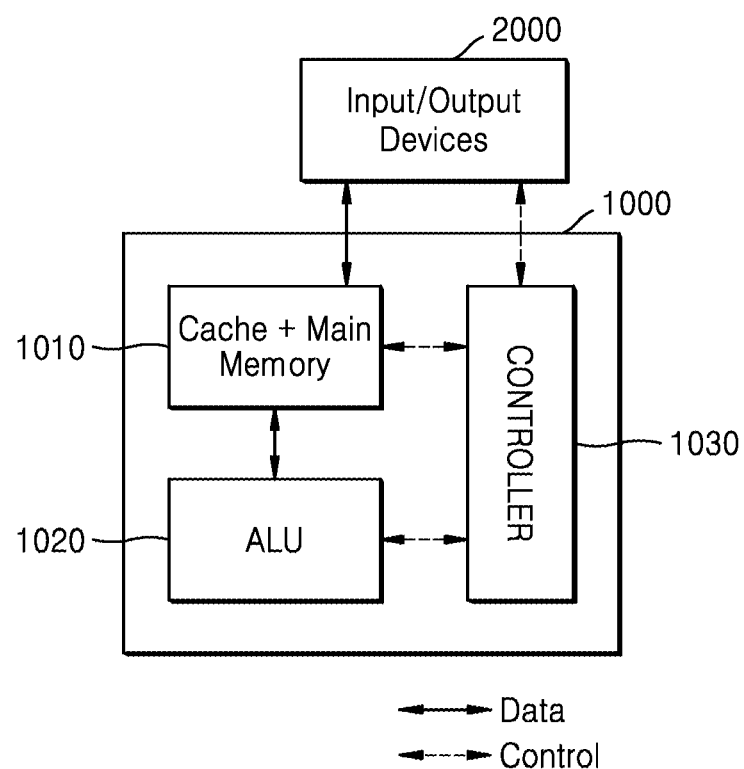
FIG. 22 is a conceptual diagram of the architecture of an electronic device according to at least one example embodiment.

FIG. 22 is a conceptual diagram of the architecture of an electronic device according to at least one example embodiment.

Referring to FIG. 22, the electronic device may include a memory unit 1010, an arithmetic logic unit (ALU) 1020, and a controller 1030, all of which may be formed in one chip 1000. The chip 1000 may be formed by monolithically integrating the memory 1010, the ALU 1020, and the controller 1030 on an identical substrate. Each of the ALU 1020 and the controller 1030 may include a 'first device' according to the above-described embodiment, and the memory 1010 may include a 'second device' according to the above-described embodiment. In other words, each of the ALU 1020 and the controller 1030 may include a logic device, which includes a domain layer including a ferroelectric domain and having a substantially non-hysteretic behavior characteristic. In other words, the memory 1010 may include a memory device, which may include a domain layer including a ferroelectric domain and having hysteretic behavior characteristics. The memory 1010, the ALU 1020, and the controller 1030 may be directly connected to each other via a metal line on-chip to communicate with each other directly. The memory 1010 may include both a main memory and a cache memory. The chip 1000 may be referred to as an on-chip memory processor. An input/output device 2000 connected to the chip 1000 may further be provided.

The electronic device of FIG. 22 may be manufactured by integrating a memory and a logic device in one chip, and therefore may be advantageous in terms of cost. Further, when the electronic device of FIG. 22 is applied to, for example, a neuromorphic device field, where the amount of data transferred between the memory and the logic device is large and data transfer is continuous, various effects such as efficiency improvement, speed improvement, and reduction of power consumption may be obtained. Since the basic construction and operation of a neuromorphic device is well known, a detailed description thereof will not be given herein.

In some cases, the electronic device according to at least one example embodiment may be implemented as having an architecture in which computing devices and memory devices are formed adjacent to each other without distinguishing sub-units in one chip.

Units and/or devices according to one or more example embodiments, for example, the controller 1030 may be implemented using hardware, software, and/or a combination thereof. For example, hardware devices may be implemented using processing circuitry such as, but not limited to, a processor, a central processing unit (CPU), an arithmetic logic unit (ALU), a digital signal processor, a microcomputer, a field programmable gate array (FPGA), a system-on-chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, a CPU, an ALU, a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording media, including tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such a separate computer readable storage medium may include a universal serial bus (USB) flash drive, a memory stick, a Blu-ray/DVD/CD-ROM drive, a memory card, and/or other similar computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other similar medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one of ordinary skill in the art will appreciate that a hardware device may include multiple processing elements and multiple types of processing elements. For example, a hardware device may include multiple processors or a processor and a controller. In addition, other processing configurations are possible, such as parallel processors.

Figure 23:
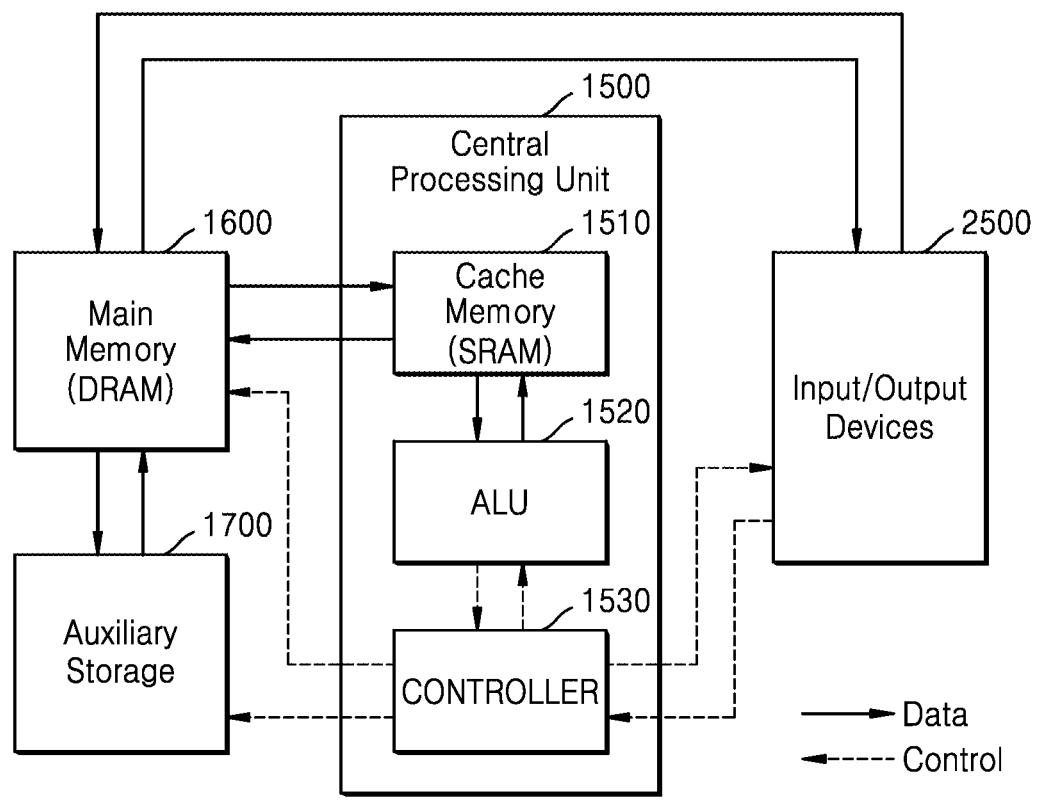
FIG. 23 is a conceptual diagram of the architecture of an electronic device according to a comparative example.

FIG. 23 is a conceptual diagram of the architecture of an electronic device according to a comparative example.

Referring to FIG. 23, the electronic device may include a CPU chip 1500 that may include a cache memory 1510, an ALU 1520, and a controller 1530. The electronic device of FIG. 23 may further include a main memory 1600 and an auxiliary storage 1700, which may be provided separately from the CPU chip 1500, and an input/output device 2500. The cache memory 1510 may be static random access memory (SRAM), and the main memory 1600 may be dynamic random access memory (DRAM).

Such a structure of the electronic device of FIG. 23 in which the main memory 1600 and devices (e.g., 1520 and 1530) responsible for logic are separated from each other requires a plurality of different chips, which is disadvantageous in terms of cost. In addition, in an application field where the amount of data transferred between the main memory 1600 and the CPU chip 1500 is large and data transfer is continuous, the structure of the electronic device of FIG. 23 is inefficient in terms of architecture and power consumption is large.

Furthermore, since the DRAM of the main memory 1600 has a 1T (transistor)-1C (capacitor) structure and the SRAM of the cache memory 1510 has a 6T (transistor) structure, a feature size of the memory cells is large and there are disadvantages in various aspects such as power consumption.

Figure 24:
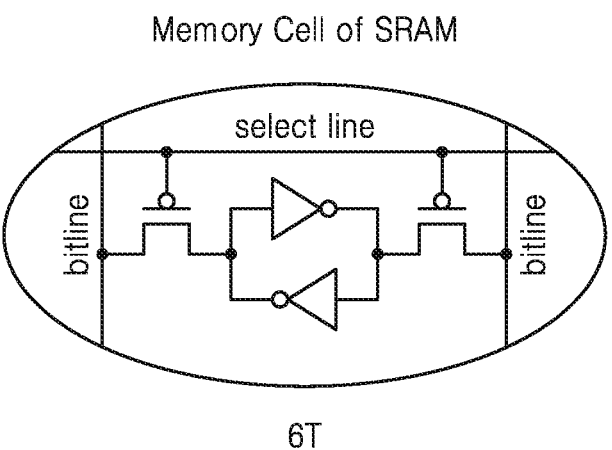
FIG. 24 is a circuit diagram of a memory cell of static random access memory (SRAM) applied to a cache memory in the electronic device according to the comparative example of FIG. 23.

FIG. 24 is a circuit diagram of a memory cell of SRAM applied to a cache memory in the electronic device according to the comparative example of FIG. 23.

Referring to FIG. 24, the memory cell of the SRAM may have a configuration including 6 transistors, that is, a 6T (transistor) structure. The 6T structure may be connected between a bit line and a select line. Since the memory cell includes 6 transistors, there is a disadvantage that the feature size is large and the power consumption is also large.

Figure 25:
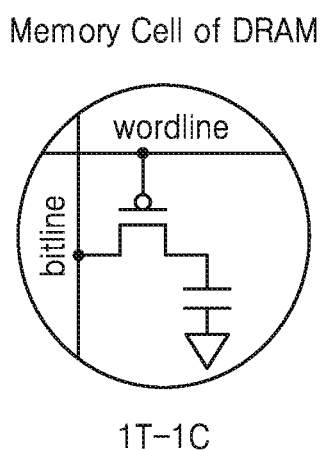
FIG. 25 is a circuit diagram of a memory cell of DRAM applied to a main memory in the electronic device according to the comparative example of FIG. 23.

FIG. 25 is a circuit diagram of a memory cell of DRAM applied to a main memory in the electronic device according to the comparative example of FIG. 23.

Referring to FIG. 25, the memory cell of the DRAM may have a structure including one transistor and one capacitor, that is, a 1T (transistor)-1C (capacitor) structure. The 1T-1C structure may be connected between a bit line and a word line. The memory cell of the 1T-1C structure also has a disadvantage that a feature size is large, a refresh operation is repeatedly required (power consumption is increased), and it is difficult to miniaturize a capacitor.

However, a memory device (memory cell) used in at least one example embodiment, that is, a second device may have a 1T (transistor) structure. That is, the memory cell may be constructed with one transistor. Therefore, there is an advantage that the structure is simple and the feature size is very small. Further, since the memory cell is a cell of a nonvolatile memory (a kind of ferroelectric random access memory (FRAM)), a refresh operation is not required and power consumption may be reduced. In addition to the main memory, a cache memory may be replaced with a 1T type memory using a ferroelectric. Therefore, when the memory device (e.g., the second device) according to at least one example embodiment is used, the memory device may have various advantages in terms of structure, size, power consumption, and the like of a memory cell.

Figure 26A:
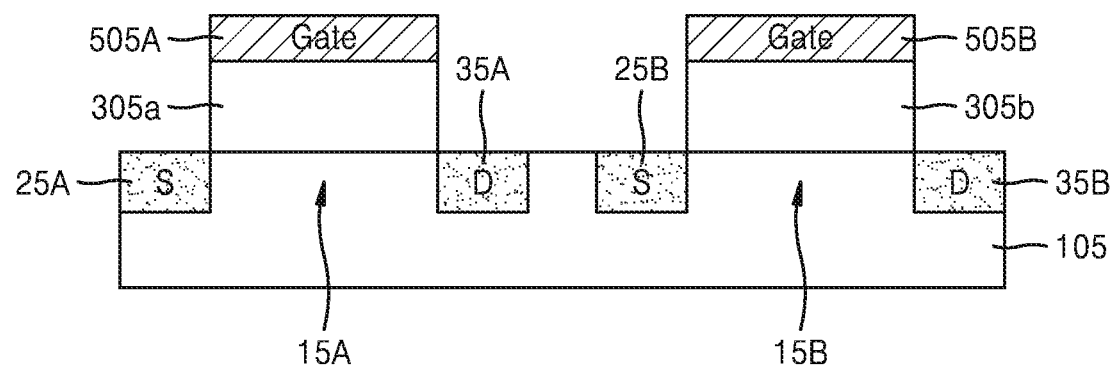
FIGS. 26A to 26C are cross-sectional views illustrating a method of manufacturing an electronic device according to at least one example embodiment.
Figure 26B:
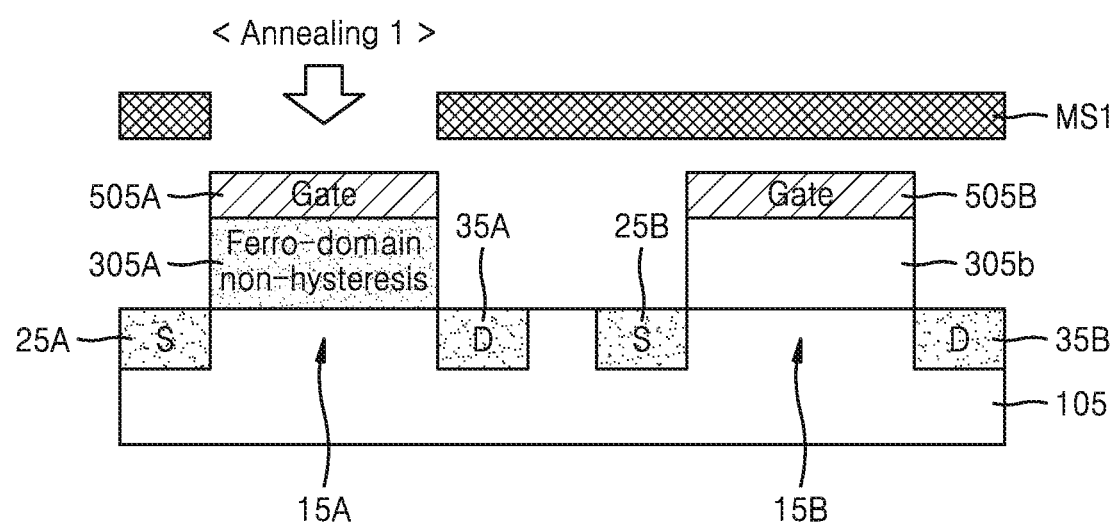
Figure 26C:
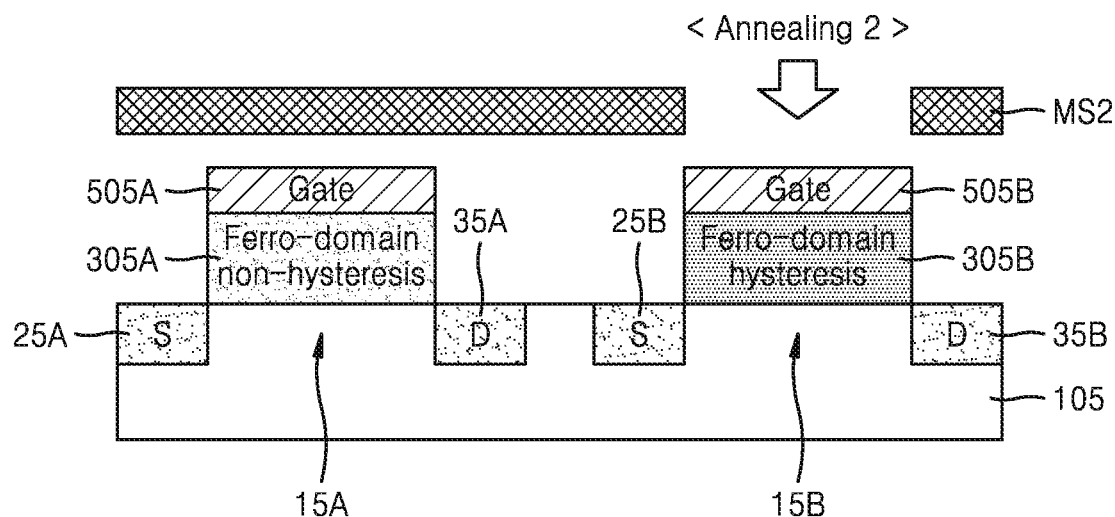

FIGS. 26A to 26C are cross-sectional views illustrating a method of manufacturing an electronic device according to at least one embodiment.

Referring to FIG. 26A, the electronic device may include a substrate 105 including first and second channels 15A and 15B, wherein a stack structure of a first amorphous thin film 305a and a first gate electrode 505A may be formed on the first channel 15A, and a stack structure of a second amorphous thin film 305b and a second gate electrode 505B may be formed on the second channel 15B. An amorphous material layer and a conductive material layer are sequentially deposited on the substrate 105 and then patterned to form first and second amorphous thin films 305a and 305b from the amorphous material layer and to form the first and second gate electrodes 505A and 505B from the conductive material layer. The amorphous material layer may be deposited by a process such as atomic layer deposition (ALD) or chemical vapor deposition (CVD), and the conductive material layer may be deposited by a process such as ALD, CVD, or physical vapor deposition Process (PVD).

The first and second amorphous thin films 305a and 305b may be thin films having a relatively high dielectric constant. For example, the dielectric constant of the first and second amorphous thin films 305a and 305b may be about 10 or more. In this regard, the first and second amorphous thin films 305a and 305b may be referred to as high-k dielectric layers. The first and second amorphous thin films 305a and 305b may include at least one of, for example, a Hf-based oxide and a Zr-based oxide. The Hf-based oxide may be HfO or HfZrO. The Zr-based oxide may be ZrO or the like. Here, HfO, HfZrO, and ZrO are expressed by ignoring the composition ratio of constituent elements. The first and second amorphous thin films 305a and 305b may include an identical base material. If necessary, at least one of the first and second amorphous thin films 305a and 305b may further include a dopant. The dopant may include at least one of Si, Al, Zr, Y, La, Gd, Sr, and Hf. When the first amorphous thin film 305a includes the dopant, the amorphous thin film 305a may be doped to the same concentration (substantially the same concentration) in its entirety, or may be doped to different concentrations (levels) depending on the region. In addition, depending on the region of the first amorphous thin film 305a, different dopants may be doped.

Before the first and second amorphous thin films 305a and 305b and the first and second gate electrodes 505A and 505B are formed, first and second sources 25A and 25B and first and second drains 35A and 35B may be formed. The first and second amorphous thin films 305a and 305b and the first and second gate electrodes 505A and 505B may be formed after the first and second sources 25A and 25B and the first and second drains 35A and 35B are formed by ion-implanting a certain dopant into different regions of the substrate 105. However, time point at which the source 25 and the drain 35 are formed may vary. The sources 25A and 25B and the drains 35A and 35B may be formed in the substrate 105 after the first and second amorphous thin films 305a and 305b and the first and second gate electrodes 505A and 505B are formed.

Referring to FIG. 26B, an annealing process for the first amorphous thin film 305a may be performed using a first photomask MS1 to form a first domain layer 305A from the first amorphous thin film 305a. The first photomask MS1 may have an opening for exposing the first gate electrode 505A and may anneal the first amorphous thin film 305a by irradiating light from a certain light source through the opening. The annealing process may be performed at a temperature in the range from about 400° C. to about 1200° C. The first amorphous thin film 305a may be crystallized through the annealing process and a ferroelectric material region and an anti-ferroelectric material region may be formed from the first amorphous thin film 305a. When the annealing process is performed while the first gate electrode 505 is in contact with the first amorphous thin film 305a, crystallization of the first amorphous thin film 305a may be more easily performed.

Referring to FIG. 26C, an annealing process for the second amorphous thin film 305b may be performed using a second photomask MS2 to form a second domain layer 305B from the second amorphous thin film 305b. The second photomask MS2 may have an opening for exposing the second gate electrode 505B and may anneal the second amorphous thin film 305b by irradiating light from a certain light source through the opening. The annealing process may be performed at a temperature in the range from about 400° C. to about 1200° C. Conditions of the annealing process in this operation may be different from those of the annealing process described in the operation of FIG. 26B. The second amorphous thin film 305b may be crystallized through the annealing process and the second amorphous thin film 305b may become a ferroelectric layer or a ferroelectric dominant layer, that is, the second domain layer 305B.

The ratio of the ferroelectric material region to the anti-ferroelectric material region formed in the first domain layer 305A and the second domain layer 305B may vary depending on the annealing conditions. In the first domain layer 305A, the first domain layer 305A may have substantially a non-hysteretic behavior characteristic by capacitance matching. The second domain layer 305B may be a ferroelectric layer or a ferroelectric dominant layer, and may have a non-hysteretic behavior characteristic.

If necessary, at least one of the first and second domain layers 305A and 305B may be formed through two or more deposition processes or two or more doping processes. Further, the electronic device may be manufactured through three or more annealing processes instead of the two annealing processes. Alternatively, the electronic device may be manufactured by a single annealing process described above.

Figure 27A:
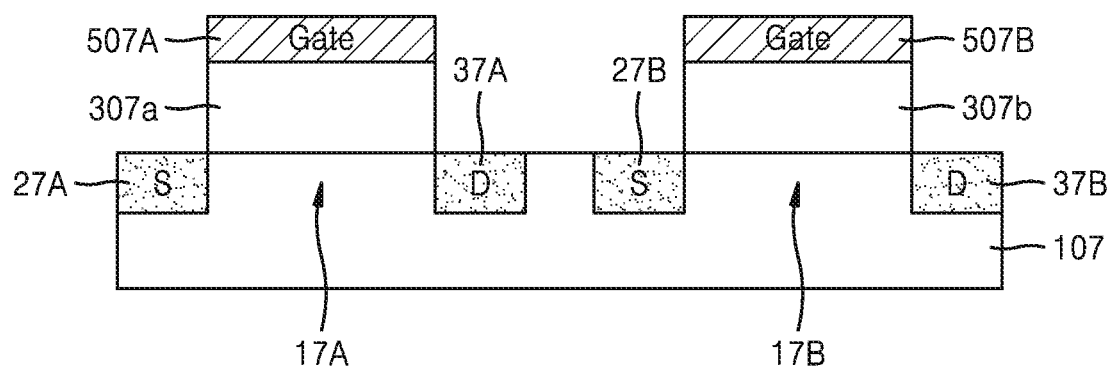
FIGS. 27A to 27C are cross-sectional views illustrating a method of manufacturing an electronic device according to at least one example embodiment.
Figure 27B:
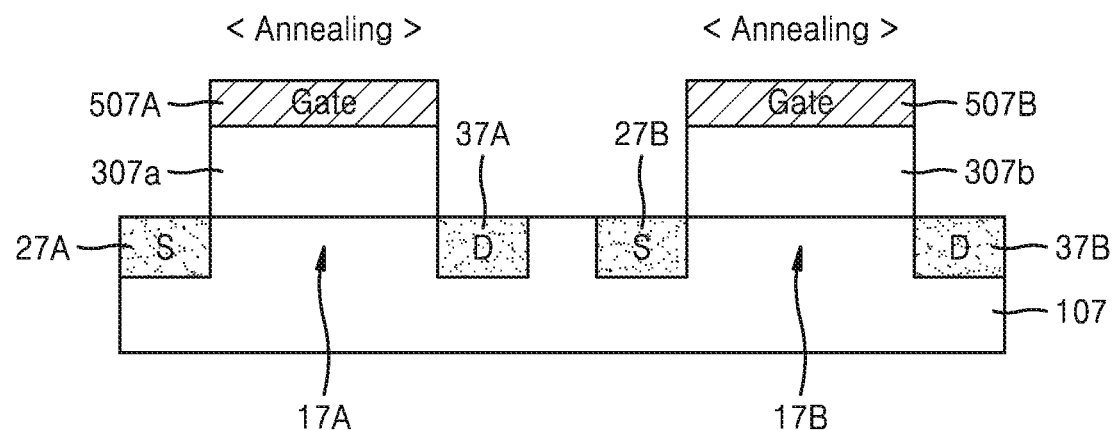
Figure 27C:
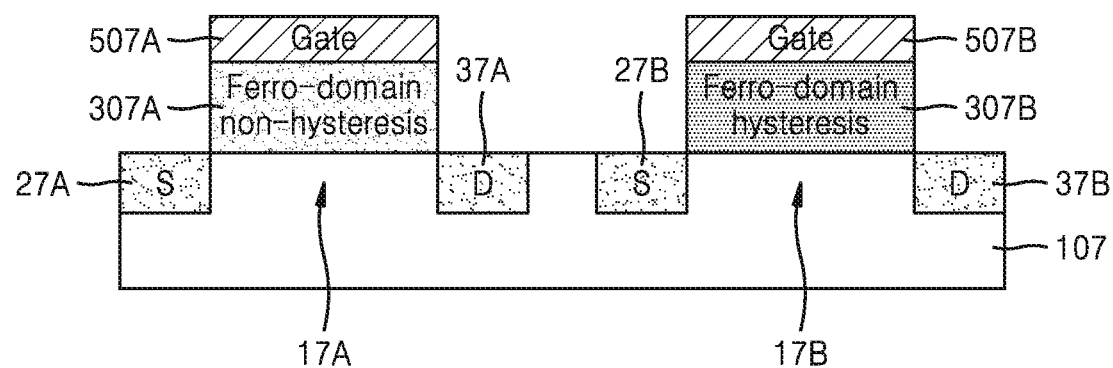

FIGS. 27A to 27C are cross-sectional views illustrating a method of manufacturing an electronic device according to at least one example embodiment.

Referring to FIG. 27A, the electronic device may include a substrate 107 including first and second channels 17A and 17B, wherein a stack structure of a first amorphous thin film 307a and a first gate electrode 507A may be formed on the first channel 17A, and a stack structure of a second amorphous thin film 307b and a second gate electrode 507B may be formed on the second channel 17B. First and second sources 27A and 27B and first and second drains 37A and 37B may be formed on the substrate 107.

The first and second amorphous thin films 307a and 307b may include different materials or may have different doping concentrations. For example, the first and second amorphous thin films 307a and 307b may have different doping concentrations or may include different doping materials, including an identical base material. Alternatively, the first and second amorphous thin films 307a and 307b may include different base materials. When the first and second amorphous thin films 307a and 307b include different base materials, the doping concentrations or doping materials of the base materials may be controlled to be the same as or different from each other. When the first amorphous thin film 307a includes a dopant, the first amorphous thin film 307a may be doped to have the same concentration (or substantially the same concentration) in its entirety, or may be doped to have different concentrations (levels) in regions thereof. In addition, depending on the region of the first amorphous thin film 307a, different dopants may be doped.

Referring to FIG. 27B, an annealing process for the first and second amorphous thin films 307a and 307b may be performed. The annealing process may be performed at a temperature in the range from about 400° C. to about 1200° C. The first and second amorphous thin films 307a and 307b may be crystallized through the annealing process. A crystallization characteristic of the first amorphous thin film 307a and a crystallization characteristic of the second amorphous thin film 307b may be different from each other. A resultant product of the annealing process is shown in FIG. 27C.

Referring to FIG. 27C, a first domain layer 307A may be formed from the first amorphous thin film 307a (of FIG. 27B), and a second domain layer 307B may be formed from the second amorphous thin film 307b (of FIG. 27B). The first domain layer 307A may include at least one ferroelectric material region and at least one anti-ferroelectric material region. The second domain layer 307B may be a ferroelectric layer or a ferroelectric dominant layer. Arrangement and arrangement relationship of the at least one ferroelectric material region and the at least one anti-ferroelectric material region included in the first domain layer 307A may be the same as or similar to those described with reference to FIGS. 2 to 8.

Although various details have been specifically described in the above description, they should not be construed as limiting the scope of the present disclosure, but rather should be construed as examples of specific embodiments. For example, those of ordinary skill in the art will appreciate that the configurations of the electronic devices of FIGS. 1 to 8, 21, and 22 may be modified in various ways. In addition, it will be understood that the methods of manufacturing the electronic devices described with reference to FIGS. 26A to 22C and 27A to 27C may be variously modified. Furthermore, it will be understood that the application fields of the electronic devices according to the example embodiment may vary. While one or more example embodiments have been described with reference to the figures, it will be understood by those of ordinary skill in the art that various changes in form and details may be made therein without departing from the spirit and scope as defined by the following claims.

What is claimed is:

1. An electronic device comprising:
a substrate;
a first device on a first region of the substrate; and
a second device on a second region of the substrate,
wherein the first device comprises:
a first gate electrode apart from the substrate; and
a first domain layer comprising a ferroelectric domain between the substrate and the first gate electrode, and
the second device comprises:
a second gate electrode apart from the substrate; and
a second domain layer comprising a ferroelectric domain between the substrate and the second gate electrode,
wherein the first domain layer and the second domain layer have different characteristics from each other at a polarization change according to an electric field.

2. The electronic device of claim 1, wherein the first domain layer has substantially a non-hysteretic behavior characteristic at the polarization change according to the electric field, and
the second domain layer has a hysteretic behavior characteristic at the polarization change according to the electric field.

3. The electronic device of claim 1, wherein the first domain layer is a non-memory element and the first device is a logic device, and
the second domain layer is a memory element and the second device is a memory device.

4. The electronic device of claim 1, wherein the first domain layer comprises a ferroelectric material region and an anti-ferroelectric material region, and
the second domain layer comprises a ferroelectric layer or a ferroelectric dominant material composition.

5. The electronic device of claim 1, wherein the first domain layer comprises a ferroelectric material region and an anti-ferroelectric material region, and
the ferroelectric material region and the anti-ferroelectric material region have different crystalline phases.

6. The electronic device of claim 5, wherein the ferroelectric material region has an orthorhombic crystalline phase, and
the anti-ferroelectric material region has a tetragonal crystalline phase.

7. The electronic device of claim 1, wherein the first domain layer and the second domain layer comprise an identical base material.

8. The electronic device of claim 1, wherein the first domain layer and the second domain layer have different doping concentrations.

9. The electronic device of claim 1, wherein at least one of the first domain layer and the second domain layer comprises at least one of a Hf-based oxide or a Zr-based oxide.

10. The electronic device of claim 1, wherein at least one of the first domain layer and the second domain layer comprises a dopant, and the dopant comprises at least one of silicon (Si), aluminum (Al), zirconium (Zr), yttrium (Y), lanthanum (La), gadolinium (Gd), strontium (Sr), and hafnium (Hf).

11. The electronic device of claim 1, wherein the first device further comprises a first channel, and a first source and a first drain both connected to the first channel, and the first domain layer and the first gate electrode are sequentially arranged on the first channel, and
the second device further comprises a second channel and a second source and a second drain both connected to the second channel and the second domain layer and the second gate electrode are sequentially arranged on the second channel.

12. The electronic device of claim 11, wherein the first domain layer is in direct contact with the first channel, and
the second domain layer is in direct contact with the second channel.

13. The electronic device of claim 11, further comprising at least one of:
a first dielectric layer between the first channel and the first domain layer; and a second dielectric layer between the second channel and the second domain layer.

14. The electronic device of claim 13, further comprising at least one of:
a first conductive layer between the first dielectric layer and the first domain layer; and
a second conductive layer between the second dielectric layer and the second domain layer.

15. The electronic device of claim 11, wherein at least one of the first channel and the second channel comprises at least one of Si, germanium (Ge), SiGe, a DI-V group semiconductor, an oxide semiconductor, a nitride semiconductor, an oxynitride semiconductor, a two-dimensional (2D) material, a quantum dot, and an organic semiconductor.

16. The electronic device of claim 1, further comprising:
a memory;
an arithmetic logic unit (ALU); and
a controller,
wherein the memory, the ALU and the controller are monolithically integrated on the substrate, and
each of the ALU and the controller comprises the first device, and the memory unit comprises the second device.

17. The electronic device of claim 1, further comprising a neuromorphic device.

18. A method of manufacturing an electronic device, the method comprising:
forming a first stack in which a first amorphous thin film and a first gate electrode for a second device are sequentially stacked on a first region of a substrate and a second stack in which a second amorphous thin film and a second gate electrode for a second device are sequentially stacked on a second region of the substrate;
annealing the first amorphous thin film to form a first domain layer comprising a ferroelectric domain from the first amorphous thin film; and
annealing the second amorphous thin film to form a second domain layer comprising a ferroelectric domain from the second amorphous thin film,
wherein the first domain layer and the second domain layer have different characteristics from each other at a polarization change according to an electric field.

19. The method of claim 18, wherein the first amorphous thin film and the second amorphous thin film comprise an identical base material, and
the annealing for the first amorphous thin film and the annealing of the second amorphous thin film are performed under different conditions.

20. The method of claim 18, wherein the first amorphous thin film and the second amorphous thin film comprise different doping materials or have different doping concentrations, and
the annealing of the first amorphous thin film and the annealing of the second amorphous thin film are performed under identical conditions.

21. The method of claim 18, wherein the first domain layer comprises a ferroelectric material region and an anti-ferroelectric material region, and
the second domain layer comprises a ferroelectric layer or a ferroelectric dominant material composition.

22. The method of claim 18, further comprising:
forming a first channel, and a first source and a first drain both connected to the first channel in the first region of the substrate; and
forming a second channel and a second source and a second drain both connected to the second channel in the second region of the substrate.

* * * * *